United States Patent
Choi

[19]

[11] Patent Number: 6,114,422
[45] Date of Patent: Sep. 5, 2000

[54] RESIST COMPOSITION CONTAINING DIALKYL MALONATE IN BASE POLYMER

[75] Inventor: Sang-jun Choi, Seoul, Rep. of Korea

[73] Assignee: Samsung Electronics Co., Ltd., Suwon, Rep. of Korea

[21] Appl. No.: 09/313,808

[22] Filed: May 18, 1999

[30] Foreign Application Priority Data

Oct. 29, 1998 [KR] Rep. of Korea ............. 98-45736

[51] Int. Cl.⁷ .............................. C08K 3/20; G03F 7/039
[52] U.S. Cl. .................... 524/247; 524/251; 430/170; 430/270.1; 430/905; 430/910
[58] Field of Search ................. 430/270.1, 170, 430/905, 910; 524/247, 251

[56] References Cited

U.S. PATENT DOCUMENTS

| | | | |
|---|---|---|---|
| 5,556,734 | 9/1996 | Yamachika et al. | 430/270.1 |
| 5,663,035 | 9/1997 | Masuda et al. | 430/270.1 |
| 5,733,704 | 3/1998 | Choi et al. | 430/270.1 |

*Primary Examiner*—Kriellion Sanders
*Attorney, Agent, or Firm*—Cantor Colburn LLP

[57] ABSTRACT

A resist composition including (a) a polymer used in a chemically amplified resist and represented by the following formula:

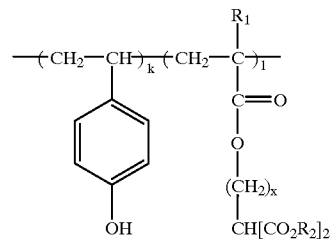

wherein $R_1$ is selected from the group consisting of —H and —$CH_3$, $R_2$ is selected from the group consisting of t-butyl, tetrahydropyranyl and 1-alkoxyethyl groups, x is an integer of 1 to 4, and $k/(k+1)$ is 0.5 to 0.9, and (b) 1–15% by weight of a photoacid generator (PAG) on the basis of the weight of the polymer.

23 Claims, No Drawings

RESIST COMPOSITION CONTAINING DIALKYL MALONATE IN BASE POLYMER

BACKGROUND OF THE INVENTION

1. Field of the Invention

The present invention relates to a resist composition used in chemically amplified resist, and more particularly, to a resist composition which can form a high resolution pattern in lithography.

2. Description of the Related Art

With the increase of integration of semiconductor chips, a resist capable of forming a finer pattern is necessary. Thus, it is necessary to use deep-ultraviolet rays (248 nm) with a shorter wavelength than conventional g-line (436 nm) or i-line (365 nm) rays, and a chemically amplified resist has been introduced in recent years accordingly.

Conventionally, a chemically amplified resist comprised of a base resin having a ter-butoxy carbonyl (t-BOC) group where acidolysis occurs easily under an acid catalyst, as a pendant group, has been used. However, the base resin has a lower decomposition temperature than a glass transition temperature. Thus, a T-top profile of a pattern may be caused in lithography, that is, severely affected by environmental contamination.

SUMMARY OF THE INVENTION

To solve the above problem, it is an object of the present invention to provide a resist composition which is advantageous to formation of a high resolution pattern by a remarkably substantial difference in solubility between before and after exposure, and has excellent thermal properties.

Accordingly, to achieve the above object, there is provided a resist composition including:

(a) a polymer used in a chemically amplified resist and represented by the following formula:

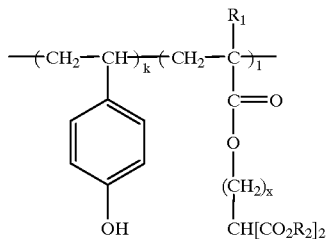

wherein $R_1$ is selected from the group consisting of —H and —$CH_3$, $R_2$ is selected from the group consisting of t-butyl, tetrahydropyranyl and 1-alkoxyethyl groups, x is an integer of 1 to 4, and $k/(k+1)$ is 0.5 to 0.9; and (b) 1–15% by weight of a photoacid generator (PAG) on the basis of the weight of the polymer.

The polymer has a weight-average molecular weight of 5,000–100,000.

Preferably, $R_1$ of the polymer is —H and $R_2$ is t-butyl.

Also, preferably, $R_1$ is —$CH_3$ and $R_2$ is t-butyl.

The PAG is selected from the group consisting of triarylsulfonium salts, diaryliodonium salts, sulfonates and mixtures thereof.

Preferably, the PAG is selected from the group consisting of triphenylsulfonium triflate, succinimidyl triflate and mixtures thereof.

The resist composition further comprises an organic base.

The content of the organic base is 0.01–2.0% by weight on the basis of the weight of the polymer.

The organic base is selected from the group consisting of triethyl amine, triisobutyl amine, diethanol amine, triethanol amine and mixtures thereof.

According to another aspect of the present invention, there is provided a resist composition comprising:

(a) a polymer blend used in a chemically amplified resist and having a polymer represented by the following formula (I):

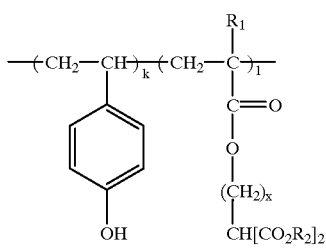

wherein $R_1$ is selected from the group consisting of —H and —$CH_3$, $R_2$ is selected from the group consisting of t-butyl, tetrahydropyranyl and 1-alkoxyethyl groups, x is an integer of 1 to 4, and $k/(k+1)$ is 0.5 to 0.9, and a polymer represented by the following formula (II):

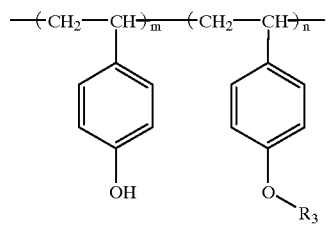

wherein $R_3$ is selected from the group consisting of t-butyl, tetrahydropyranyl, 1-alkoxyethyl and t-butoxycarbonyl groups, and $m/(m+n)$ is 0.5 to 0.9; and (b) 1–15% by weight of a photoacid generator (PAG) on the basis of the weight of the polymer blend.

The polymer I and the polymer II have a weight-average molecular weight of 5,000–100,000, respectively.

The content of the polymer I is 10–90% by weight on the basis of the weight of the polymer blend.

Preferably, $R_1$ of the polymer is —H, $R_2$ is t-butyl and $R_3$ is 1-ethoxyethyl.

Also, preferably, $R_1$ is —H, $R_2$ is t-butyl and $R_3$ is tetrahydropyranyl.

Further, $R_1$ is —H, $R_2$ is t-butyl and $R_3$ is t-butoxycarbonyl.

Also, preferably, $R_1$ is —$CH_3$, $R_2$ is t-butyl and $R_3$ is ethoxyethyl.

Preferably, $R_1$ is —$CH_3$, $R_2$ is t-butyl and $R_3$ is tetrahydropyranyl.

Further, preferably, $R_1$, is —$CH_3$, $R_2$ is t-butyl and $R_3$ is t-butoxycarbonyl.

The resist composition further comprises an organic base.

In the resist composition according to the present invention, since a difference in solubility to a developing solution is substantial between before and after exposure, the contrast of resist is excellent. Also, the thermal properties are excellent due to a high decomposition temperature.

DESCRIPTION OF THE PREFERRED EMBODIMENTS

Example 1

Synthesis of di-t-butylmalonylpropyl Acrylate (DBMPA)

4.8 g (0.12 mol) of sodium hydride was dissolved in 250 ml of tetrahydrofuran (THF) and then 25 g (0.11 mol) of di-t-butyl malonate was slowly added dropwise and reacted at room temperature for 1 hour.

Thereafter, 18 g (0.1 mol) of 2-bromoethyl acrylate was slowly added dropwise to the obtained solution at a temperature of 0° C. and reacted at room temperature for 12 hours.

After the reaction is completed, excess THF is evaporated and the remainder was poured into excess water. Then, the reactant was neutralized using HCl and extracted using diethyl ether.

The obtained extractive was dried using magnesium sulfate ($MgSO_4$) and then product was obtained using vacuum distillation (yield: 60%).

Example 2

Synthesis of Poly (DBMPA-co-AST)

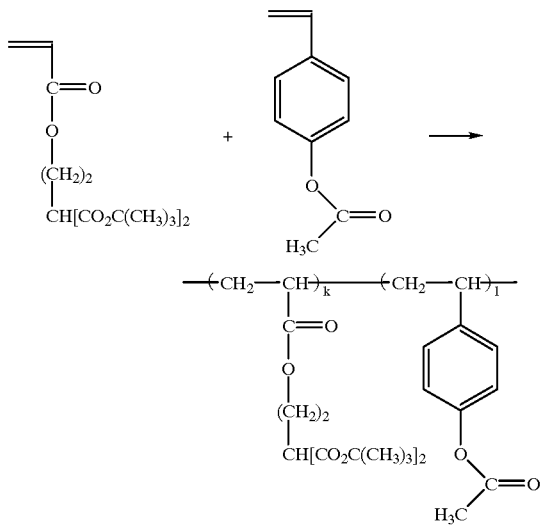

2.8 g (9 mmol) of DBMPA and 4.5 g (27 mmol) of acetoxy styrene (AST) were dissolved in 35 ml of toluene together with 0.35 g of azobisisobutyronitrile (AIBN) and then purged using nitrogen for 1 hour and polymerized at 70° C. for 24 hours.

After polymerization, the obtained product was precipitated in excess (10 times) n-hexane and dried at a vacuum oven maintained at 50° C. for 24 hours, and then the product was recovered (yield: 70%).

Here, the weight-average molecular weight of the obtained product was 12,500 and the polydispersity thereof was 1.87.

Example 3

Synthesis of Poly (DBMPA-co-HST)

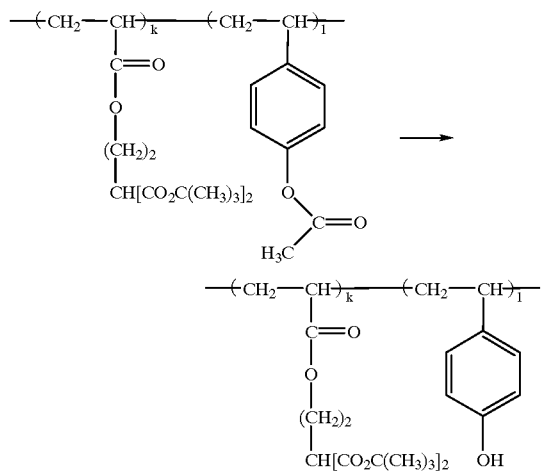

10 g of poly (DBMPA-co-AST) was reacted in a mixture solution of 28% (10 ml) of ammonium hydroxide ($NH_4OH$) solution and 50 ml of methanol for 4 hours under reflux conditions, and then the obtained product was slowly precipitated in excess water and neutralized using HCl.

The precipitate was filtered with a glass filter and then the filtered product was dissolved again in THF and reprecipitated in excess n-hexane, and then the precipitate was dried at a vacuum oven maintained at 50° C. for 20 hours and then the product was recovered (yield: 90%).

Here, the weight-average molecular weight of the obtained product was 11,300 and the polydispersity thereof was 1.86.

Example 4

Synthesis of Poly (HST-EVE)

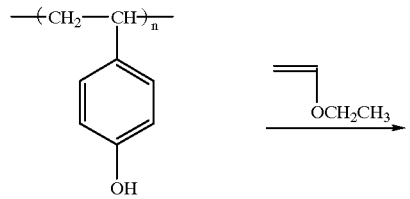

-continued

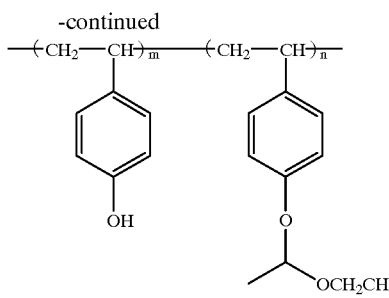

12 g of poly (hydroxysterene) (HST whose weight-average molecular weight is 10,000) was dissolved in 100 ml of THF solution, 3.6 g of ethyl vinyl ether (EVE) was mixed thereto, sulfuric acid ($H_2SO_4$) was added to the mixture in a catalytic amount and reacted at room temperature for 24 hours.

After the reaction was completed, the obtained product was slowly added dropwise to excess water and neutralized using potassium carbonate ($K_2CO_3$).

After the precipitate was filtered, the obtained precipitate was dissolved again in THF, reprecipitated in excess n-hexane and dried at a vacuum oven maintained at 50° C. for 24 hours and then the product was recovered (yield: 80%).

Example 5

Synthesis of Poly (HST-THP)

12 g of poly (hydroxystyrene) (HST whose weight-average molecular weight is 10,000) was dissolved in 100 ml of THF solution, 4.2 g of 2,3-dihydropyran (THP) was mixed thereto, p-toluene sulfonic acid (PTSA) was added to the mixture in a catalytic amount and reacted at room temperature for 20 hours.

After the reaction was completed, the obtained product was slowly added dropwise to excess water and neutralized using potassium carbonate ($K_2CO_3$).

After the precipitate was filtered, the obtained precipitate was dissolved again in THF, reprecipitated in excess n-hexane and dried at a vacuum oven maintained at 50° C. for 24 hours and then the product was recovered (yield: 90%).

Example 6

Synthesis of Poly (HST-BOC)

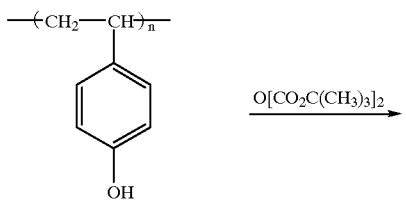

-continued

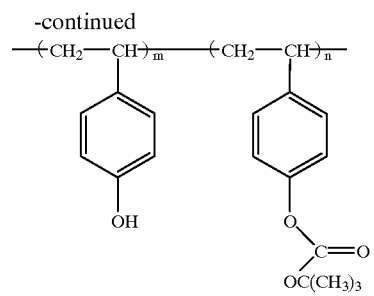

12 g of poly (hydroxysterene) (HST whose weight-average molecular weight is 10,000) and 4 g of pyridine were dissolved in 100 ml of THF solution, 11 g of di-tert-butyl dicarbonate was slowly added dropwise thereto, and reacted at 40° C. for 12 hours.

After the reaction was completed, the obtained product was slowly added dropwise to excess water and neutralized using HCl.

After the precipitate was filtered with a glass filter, the obtained precipitate was dissolved again in THF, reprecipitated in excess n-hexane and dried at a vacuum oven maintained at 50° C. for 24 hours and then the product was recovered (yield: 85%).

Example 7

Resist Composition (A)

1.0 g of poly (DBMPA-co-HST) [k/(k+1)=0.3] synthesized in Example 3 and 0.03 g of triphenyl sulfonium triflate as a photoacid generator (PAG) were completely dissolved in 6.0 g of propylene glycol monomethylether acetate (PGMEA). Thereafter, the obtained solution was filtered with a 0.2 $\mu$m membrane filter to obtain a resist composition. Then, the resist composition was coated to a thickness of about 0.5 $\mu$m on a silicon wafer treated with hexamethyldisilazane (HMDS).

The wafer coated with the resist composition was soft-baked at 130° C. for 90 seconds and exposed using a KrF excimer laser with a numerical aperture (NA) of 0.45, and then post-exposure baking (PEB) was carried out at 140° C. for 90 seconds.

Thereafter, the resultant was developed with 2.38 wt % of tetramethylammonium hydroxide (TMAH) solution for 60 seconds. As a result, it was observed that clean 0.30 $\mu$m line-and-space patterns were obtained using an exposure dose of about 20 mJ/cm$^2$.

Example 8

Resist Composition (B)

0.3 g of poly (DBMPA-co-HST) [k/(k+1)=0.25 and whose weight-average molecular weight is 11,500] synthesized in Example 3, 0.7 g of poly (HST-EVE) [n/(m+n)= 0.35] synthesized in Example 4 and 0.03 g of triphenyl sulfonium triflate as a PAG were completely dissolved in 6.0 g of propylene glycol monomethylether acetate (PGMEA). Thereafter, the obtained solution was filtered with a 0.2 $\mu$m membrane filter to obtain a resist composition. Then, the resist composition was coated to a thickness of about 0.5 $\mu$m on a silicon wafer treated with hexamethyldisilazane (HMDS).

The wafer coated with the resist composition was soft-baked at 110° C. for 90 seconds and exposed using a KrF excimer laser with a numerical aperture (NA) of 0.45, and then post-exposure baking (PEB) was carried out at 120° C. for 90 seconds.

Thereafter, the resultant was developed with 2.38 wt % of tetramethylammonium hydroxide (TMAH) solution for 60 seconds. As a result, it was observed that clean 0.30 μm line-and-space patterns were obtained using an exposure dose of about 25 mJ/cm².

Example 9

Resist Composition (C)

0.3 g of poly (DBMPA-co-HST) [k/(k+1)=0.25 and whose weight-average molecular weight is 11,500] synthesized in Example 3, 0.7 g of poly (HST-EVE) [n/(m+n)= 0.35] synthesized in Example 4 and 0.03 g of triphenyl sulfonium triflate as a PAG were dissolved in 6.0 g of propylene glycol monomethylether acetate (PGMEA), and 3 mg of triethanolamine as an organic base was added thereto to then be completely dissolved. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 110° C. for 90 seconds and exposed using a KrF excimer laser with a numerical aperture (NA) is 0.45, and then post-exposure baking (PEB) was carried out at 120° C. for 90 seconds.

Thereafter, the reactant was developed with 2.38 wt % a tetramethylammonium hydroxide (TMAH) aqueous solution for 60 seconds. As a result, it was observed that clean 0.30 μm line-and-space patterns were obtained using an exposure dose of about 33 mJ/cm².

Example 10

Resist Composition (D)

0.3 g of poly (DBMPA-co-HST) [k/(k+1)=0.25 and whose weight-average molecular weight is 11,500] synthesized in Example 3, 0.7 g of poly (HST-THP) [THP/(HST+THP)=0.33] synthesized in Example 5 and 0.03 g of triphenyl sulfonium triflate as a PAG were dissolved in 6.0 g of propylene glycol monomethylether acetate (PGMEA), and 3 mg of triisobutylamine as an organic base was added thereto to then be completely dissolved. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 110° C. for 90 seconds and exposed using a KrF excimer laser with a numerical aperture (NA) of 0.45, and then post-exposure baking (PEB) was carried out at 110° C. for 90 seconds.

Thereafter, the resultant was developed with 2.38 wt % of tetramethylammonium hydroxide (TMAH) aqueous solution for 60 seconds. As a result, it was observed that clean 0.30 μm line-and-space patterns were obtained using an exposure dose of about 30 mJ/cm².

Example 11

Resist Composition (E)

0.3 g of poly (DBMPA-co-HST) [k/(k+1)=0.25 and whose weight-average molecular weight is 11,500] synthesized in Example 3, 0.7 g of poly (HST-BOC) [n/(m+n)= 0.36] synthesized in Example 6 and 0.03 g of triphenyl sulfonium triflate as a PAG were dissolved in 6.0 g of propylene glycol monomethylether acetate (PGMEA), and 3 mg of triethanolamine as an organic base was added thereto to then be completely dissolved. Thereafter, the obtained solution was filtered with a 0.2 μm membrane filter to obtain a resist composition. Then, the resist composition was coated to a thickness of about 0.5 μm on a silicon wafer treated with hexamethyldisilazane (HMDS).

The wafer coated with the resist composition was soft-baked at 100° C. for 90 seconds and exposed using a KrF excimer laser with a numerical aperture (NA) of 0.45, and then post-exposure baking (PEB) was carried out at 110° C. for 90 seconds.

Thereafter, the resultant was developed with 2.38 wt % of tetramethylammonium hydroxide (TMAH) solution for 60 seconds. As a result, it was observed that clean 0.30 μm line-and-space patterns were obtained using an exposure dose of about 21 mJ/cm².

Since the base resin constituting the resist composition according to the present invention contains dialkyl malonate as its pendant group, the base resin is acidolyzed into a malonic acid by an acid generated by light in the presence of a photoacid generator (PAG), thereby increasing the overall polymer solubility. Therefore, the resist composition according to the present invention has a large difference in solubility to a developing solution between before and after exposure, so that the contrast of the resist is excellent. Also, the thermal properties are excellent due to a high decomposition temperature.

Although the present invention has been described in detail by way of preferred embodiments, the invention is not limited thereto, and numerous modifications and variations may be practiced by one skilled in the art within the spirit and scope of the invention.

What is claimed is:

1. A resist composition comprising:
    (a) a polymer used in a chemically amplified resist and represented by the following formula:

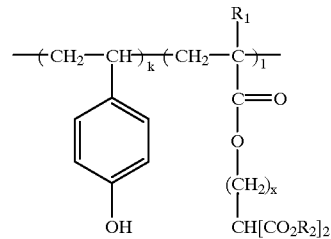

wherein $R_1$ is selected from the group consisting of —H and —CH$_3$, $R_2$ is selected from the group consisting of t-butyl, tetrahydropyranyl and 1-alkoxyethyl groups, x is an integer of 1 to 4, and k/(k+1) is 0.5 to 0.9; and
    (b) 1–15% by weight of a photoacid generator (PAG) on the basis of the weight of the polymer.

2. The resist composition according to claim 1, wherein the polymer has a weight-average molecular weight of 5,000–100,000.

3. The resist composition according to claim 1, wherein $R_1$ is —H and $R_2$ is t-butyl.

4. The resist composition according to claim 1, wherein $R_1$ is —CH$_3$ and $R_2$ is t-butyl.

5. The resist composition according to claim 1, wherein the PAG is selected from the group consisting of triarylsulfonium salts, diaryliodonium salts, sulfonates and mixtures thereof.

6. The resist composition according to claim 5, wherein the PAG is selected from the group consisting of triphenylsulfonium triflate, succinimidyl triflate and mixtures thereof.

7. The resist composition according to claim 1, further comprising an organic base.

8. The resist composition according to claim 7, wherein the content of the organic base is 0.01–2.0% by weight on the basis of the weight of the polymer.

9. The resist composition according to claim 7, wherein the organic base is selected from the group consisting of triethyl amine, triisobutyl amine, diethanol amine, triethanol amine and mixtures thereof.

10. A resist composition comprising:
   (a) a polymer blend used in a chemically amplified resist and having a polymer represented by the following formula (I):

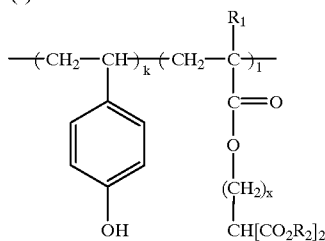

wherein $R_1$ is selected from the group consisting of —H and —$CH_3$, $R_2$ is selected from the group consisting of t-butyl, tetrahydropyranyl and 1-alkoxyethyl groups, x is an integer of 1 to 4, and k/(k+1) is 0.5 to 0.9, and a polymer represented by the following formula (II):

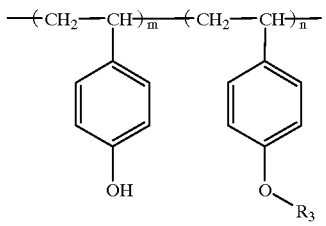

wherein $R_3$ is selected from the group consisting of t-butyl, tetrahydropyranyl, 1-alkoxyethyl and t-butoxycarbonyl groups, and m/(m+n) is 0.5 to 0.9; and (b) 1–15% by weight of a photoacid generator (PAG) on the basis of the weight of the polymer blend.

11. The resist composition according to claim 10, wherein the polymer I and the polymer II have a weight-average molecular weight of 5,000–100,000, respectively.

12. The resist composition according to claim 10, wherein the content of the polymer I is 10–90% by weight on the basis of the weight of the polymer blend.

13. The resist composition according to claim 10, wherein $R_1$ is —H, $R_2$ is t-butyl and $R_3$ is 1-ethoxyethyl.

14. The resist composition according to claim 10, wherein $R_1$ is —H, $R_2$ is t-butyl and $R_3$ is tetrahydropyranyl.

15. The resist composition according to claim 10, wherein $R_1$ is —H, $R_2$ is t-butyl and $R_3$ is t-butoxycarbonyl.

16. The resist composition according to claim 10, wherein $R_1$ is —$CH_3$, $R_2$ is t-butyl and $R_3$ is ethoxyethyl.

17. The resist composition according to claim 10, wherein $R_1$ is —$CH_3$, $R_2$ is t-butyl and $R_3$ is tetrahydropyranyl.

18. The resist composition according to claim 10, wherein $R_1$ is —$CH_3$, $R_2$ is t-butyl and $R_3$ is t-butoxycarbonyl.

19. The resist composition according to claim 10, wherein the PAG is selected from the group consisting of triarylsulfonium salts, diaryliodonium salts, sulfonates and mixtures thereof.

20. The resist composition according to claim 19, wherein the PAG is selected from the group consisting of triphenylsulfonium triflate, succinimidyl triflate and mixtures thereof.

21. The resist composition according to claim 10, further comprising an organic base.

22. The resist composition according to claim 21, wherein the content of the organic base is 0.01–2.0 wt % on the basis of the weight of the polymer blend.

23. The resist composition according to claim 21, wherein the organic base is selected from the group consisting of triethyl amine, triisobutyl amine, diethanol amine, triethanol amine and mixtures thereof.

* * * * *